(12) United States Patent
Yamasaki et al.

(10) Patent No.: US 10,212,826 B2
(45) Date of Patent: Feb. 19, 2019

(54) ELECTRONIC COMPONENT MOUNTING METHOD

(71) Applicant: Panasonic Corporation, Osaka (JP)

(72) Inventors: Norihisa Yamasaki, Osaka (JP); Yasuhiro Maenishi, Osaka (JP); Yuji Nakamura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 999 days.

(21) Appl. No.: 14/127,376

(22) PCT Filed: Mar. 7, 2013

(86) PCT No.: PCT/JP2013/001452
§ 371 (c)(1),
(2) Date: Dec. 18, 2013

(87) PCT Pub. No.: WO2013/168329
PCT Pub. Date: Nov. 14, 2013

(65) Prior Publication Data
US 2014/0230241 A1 Aug. 21, 2014

(30) Foreign Application Priority Data
May 8, 2012 (JP) .................. 2012-106424

(51) Int. Cl.
*H05K 3/30* (2006.01)
*H05K 13/08* (2006.01)

(52) U.S. Cl.
CPC ........... *H05K 3/301* (2013.01); *H05K 13/086* (2018.08); *H05K 13/087* (2018.08); *H05K 2203/01* (2013.01); *Y10T 29/53174* (2015.01)

(58) Field of Classification Search
CPC .... H05K 13/08; H05K 3/301; H05K 2203/01; Y10T 29/53174
See application file for complete search history.

(56) References Cited

U.S. PATENT DOCUMENTS

2003/0102367 A1* 6/2003 Monette ............. G05B 19/4183
235/376
2007/0270992 A1 11/2007 Nishida et al.
(Continued)

FOREIGN PATENT DOCUMENTS

JP 04-267472 A 9/1992
JP 07-044626 A 2/1995
(Continued)

OTHER PUBLICATIONS

International Search Report for Application No. PCT/JP2013/001452 dated May 14, 2013.

*Primary Examiner* — Peter DungBa Vo
*Assistant Examiner* — Jeffrey Carley
(74) *Attorney, Agent, or Firm* — Pearne & Gordon LLP

(57) ABSTRACT

After a reel of a Moisture Sensitive Device is dispatched from a component keeping area and setup to a tape feeder is performed in an external setup area, exposure time for which the Moisture Sensitive Device is in an atmospheric exposure state is timed in a reel unit, and the exposure time is compared with exposure limit time set for the Moisture Sensitive Device and stored in a storage part. An electronic component mounting apparatus equipped with the reel of the Moisture Sensitive Device whose exposure time exceeds the exposure limit time is specified, and work by the apparatus is stopped.

5 Claims, 5 Drawing Sheets

(56) References Cited

U.S. PATENT DOCUMENTS

2008/0147232 A1* 6/2008 Kuribayashi .......... H05K 13/08
                                                       700/160
2012/0048919 A1* 3/2012 Okada ................ H05K 13/0417
                                                       235/375

FOREIGN PATENT DOCUMENTS

| JP | 2001-127487 A | 5/2001 |
| JP | 2006-108322 A | 4/2006 |
| JP | 2006-310750 A | 11/2006 |
| JP | 2007-019320 A | 1/2007 |
| JP | 2012-049478 A | 3/2012 |

* cited by examiner

FIG. 3

| COMPONENT ID | COMPONENT NAME | REMAINING NUMBER | WHEREABOUTS INFORMATION | MSD FLAG | EXPOSURE LIMIT TIME | EXPOSURE TIME |
|---|---|---|---|---|---|---|
| 0001 | AAA | 1000 | KEEPING LOCATION ID1 (KEEPING RACK) | OFF | | |
| 0002 | AAA | 1500 | FEEDER ID#1 | OFF | | |
| 0003 | AAA | 3000 | KEEPING LOCATION ID1 (KEEPING RACK) | OFF | | |
| 0004 | BBB | 3000 | KEEPING LOCATION ID101 (DRY BOX) | ON | 24H | 15H |
| 0005 | BBB | 756 | FEEDER ID#3, APPARATUS ID#2, SLOT No. 11 | ON | 24H | 3H |
| 0006 | CCC | 1268 | FEEDER ID#4, APPARATUS ID#2, SLOT No. 13 | OFF | | |

ELECTRONIC COMPONENT MOUNTING METHOD

TECHNICAL FIELD

The present invention relates to an electronic component mounting system that mounts electronic components including a moisture management target component that requires moisture management in a substrate, and an electronic component mounting method in this electronic component mounting system.

BACKGROUND ART

In an electronic component mounting system for mounting an electronic component in a substrate and manufacturing a mounting substrate, many kinds of electronic components are mounted using plural types of substrates as a target, so that vast kinds and numbers of electronic components are prepared and kept in a component supply department. In the production field of component mounting, it is extremely important to properly manage such a component inventory in reducing production costs. Because of this, efforts to systematize inventory management by individually identifying an actual component such as a tape reel holding an electronic component by identification means such as a bar code and integrating the identification information and correctly grasping a component inventory state, for example, at the time of dispatch from a component warehouse or the time of supply to a production apparatus and further the time of return to the component warehouse have been made conventionally (for example, see Patent Documents 1, 2 and 3). Accordingly, troubles such as a financial waste due to overstocking or a production stop caused by a component shortage due to understocking can be prevented.

RELATED ART DOCUMENTS

Patent Document

Patent Document 1: JP-A-4-267472
Patent Document 2: JP-A-7-44626
Patent Document 3: JP-A-2001-127487

DISCLOSURE OF THE INVENTION

Problems to be Solved by the Invention

An electronic component constructing a mounting substrate includes a package component previously sealed with a resin. This package component includes "a device highly sensitive to moisture (Moisture Sensitive Device: hereinafter abbreviated as an "MSD")" in which moisture greatly influences mounting quality after reflow. The MSD is kept in a packing state set by standards in order to prevent moisture absorption and maintain a dry state. The MSD unpacked once must complete a process to reflow within available time individually defined according to a kind of component.

However, in the conventional art including the related art examples described above, keeping and use of the MSD having the characteristics described above were left to a mere memory or a record by handwork of a worker of the production field. Because of this, it was difficult to comply strictly with the available time defined, and it was necessary to frequently perform further drying treatment for removal of moisture or to reject the MSDs including the MSD having the still possible use in the case of attempting to ensure the mounting quality after reflow. Thus, the keeping and use of the MSD forcedly caused a situation interfering with an increase in productivity or a decrease in cost. As a result, establishment of a system for properly managing use of a moisture management target component such as the MSD has been desired.

An object of the invention is to provide an electronic component mounting system capable of properly managing use of a moisture management target component, and an electronic component mounting method in this electronic component mounting system.

Means for Solving the Problems

An electronic component mounting system of the present invention is an electronic component mounting system that mounts electronic components on a substrate to manufacture a mounting substrate, the electronic component mounting system having an electronic component mounting line that performs, by an electronic component mounting apparatus, component mounting work of mounting the electronic components including a moisture management target component that requires moisture management, a whereabouts information storage part that stores whereabouts information on the electronic components in a reel unit, whereabouts information writing means for storing the whereabouts information on the electronic components in the whereabouts information storage part, an exposure time management part that times exposure time for which the moisture management target component is in an atmospheric exposure state in a reel unit and records accumulated exposure time, and a mounting line control part that compares the exposure time with exposure limit time set for the moisture management target component, specifies an electronic component mounting apparatus equipped with a reel of the moisture management target component of which exposure time exceeds the exposure limit time by the whereabouts information, and stops work by the electronic component mounting apparatus.

An electronic component mounting method of the present invention is an electronic component mounting method for mounting electronic components including a moisture management target component that requires moisture management on a substrate by an electronic component mounting system having an electronic component mounting apparatus, the method including: registering whereabouts information on the electronic components in a whereabouts information storage part in a reel unit and timing, in a reel unit, exposure time for which the moisture management target component is in an atmospheric exposure state; and comparing the exposure time with exposure limit time set for the moisture management target component, specifying an electronic component mounting apparatus equipped with a reel of the moisture management target component exceeding the exposure limit time by the whereabouts information, and stopping work by the electronic component mounting apparatus.

Advantageous Effects of the Invention

According to the invention, exposure time for which a moisture management target component requiring moisture management is in an atmospheric exposure state is timed in a reel unit and the exposure time is compared with exposure limit time set for the moisture management target component and an electronic component mounting apparatus equipped with a reel of the moisture management target component exceeding the exposure limit time is specified and also work by the electronic component mounting apparatus is stopped and thereby, use of the moisture management target component can properly be managed.

BRIEF DESCRIPTION OF THE DRAWINGS

FIG. 3 is an explanatory diagram of a material management table in the electronic component mounting system of the embodiment of the invention.

MODE FOR CARRYING OUT THE INVENTION

Figure 1:
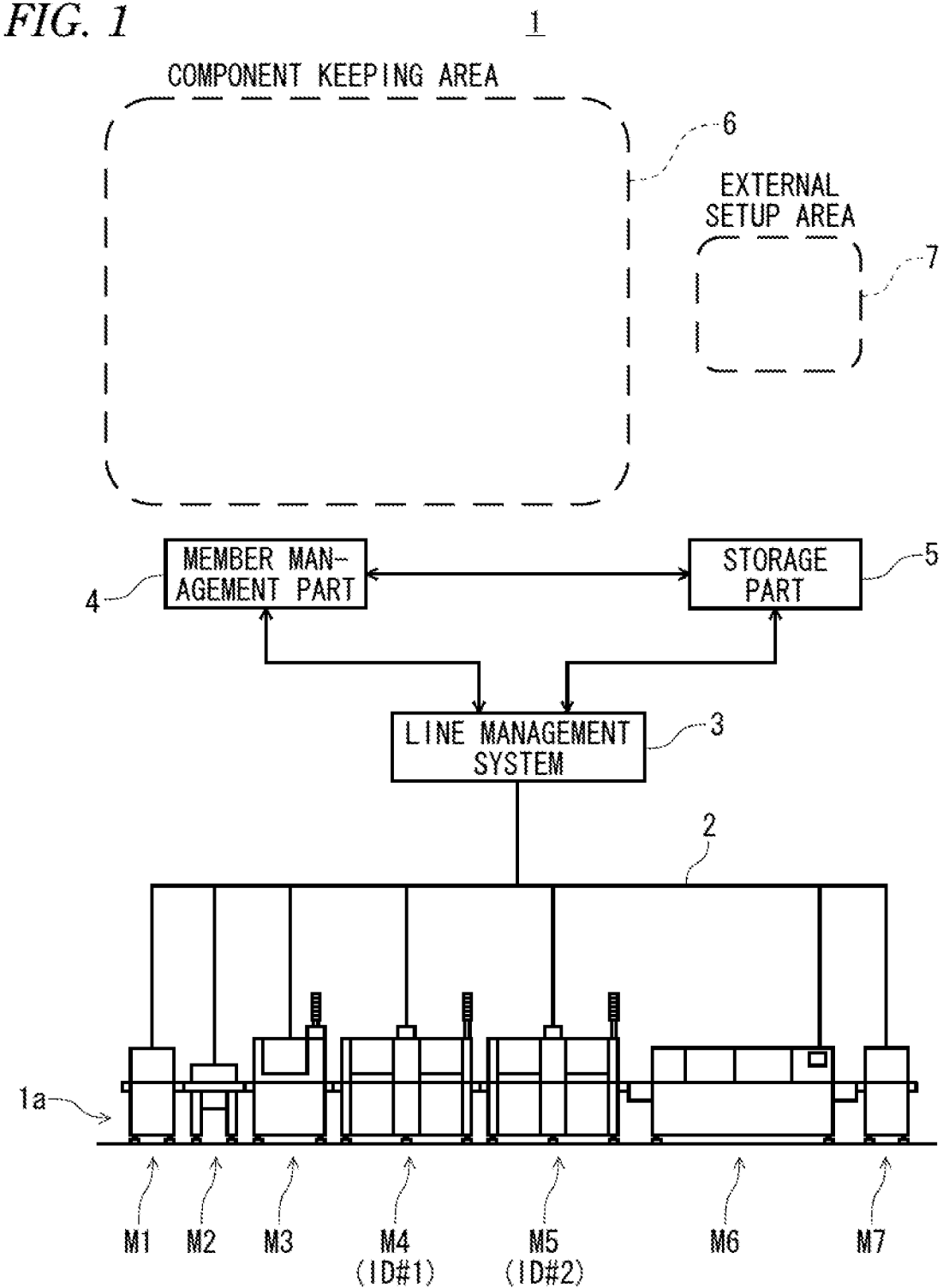
FIG. 1 is a configuration explanatory diagram of an electronic component mounting system of an embodiment of the invention.

An embodiment of the invention will hereinafter be described with reference to the drawings. FIG. 1 is a configuration explanatory diagram of an electronic component mounting system 1 of an embodiment of the invention. The electronic component mounting system 1 mounts an electronic component in a substrate and produces a mounting substrate. As shown in FIG. 1, the electronic component mounting system 1 includes a component mounting line 1a, a communication network 2, a line management system 3, a member management part 4 and a storage part 5. The component mounting line 1a is configured to couple a substrate supply apparatus M1, a substrate delivery apparatus M2, a solder printing apparatus M3, a first electronic component mounting apparatus M4, a second electronic component mounting apparatus M5, a reflow apparatus M6 and a substrate recovery apparatus M7 in series.

In component mounting work by the component mounting line 1a, a substrate supplied by the substrate supply apparatus M1 is carried into the solder printing apparatus M3 through the substrate delivery apparatus M2. The solder printing apparatus M3 does screen printing of solder for component bonding on the substrate. The substrate after the screen printing is sequentially delivered to the first electronic component mounting apparatus M4 and the second electronic component mounting apparatus M5. The first electronic component mounting apparatus M4 and the second electronic component mounting apparatus M5 install an electronic component on the substrate after the solder printing. The substrate on which the component is installed is carried into the reflow apparatus M6. The reflow apparatus M6 heats the substrate according to a predetermined heating profile. The solder for component, bonding is melted and solidified by the heating. Finally, the mounting substrate in which the electronic component is mounted in the substrate is recovered by the substrate recovery apparatus M7.

Before the work by the component mounting line 1a described above, an electronic component to be mounted is dispatched from a component keeping area 6 and predetermined setup work for use in the component mounting line 1a is done in an external setup area 7 and then the electronic component is supplied to the component mounting line 1a. In the present embodiment, the electronic component in a state housed by being held in a carrier tape and wound on a reel 8 (see FIG. 2) is targeted. After the reel 8 taken out of the component keeping area 6 is set in a tape feeder 9 (see FIG. 2) constructing a component supply unit in the external setup area 7, the reel 8 is supplied to the first electronic component mounting apparatus M4 or the second electronic component mounting apparatus M5 of the component mounting line 1a. Unconsumed components left after execution of predetermined component mounting work are again detached from the tape feeder 9 and are returned to the component keeping area 6. That is, in the present embodiment, the first electronic component mounting apparatus M4 and the second electronic component mounting apparatus M5 are configured to supply the electronic component through the component supply unit constructed so as to set the reel 8 in the tape feeder 9.

Each apparatus included in the component mounting line 1a is connected to the line management system 3 through the communication network 2. The line management system 3 is connected to the storage part 5 and the member management part 4 of a system management computer for performing centralized control of the electronic component mounting system 1. The member management part 4 performs processing necessary for member management including each work of acceptance, dispatch and return of the reel 8 to the component keeping area 6. The storage part 5 stores information necessary for each processing by the member management part 4.

In the electronic component mounting system 1, information about the reel 8 used in the component mounting work includes whereabouts information for specifying a whereabouts location. The information about the reel 8 is managed by the member management part 4 and is recorded on the storage part 5. That is, whereabouts information about the reel 8 in the component keeping area 6 or the external setup area 7 is transmitted to the member management part 4 through a wireless LAN etc. and is written into the storage part 5. Also, whereabouts information about the reel 8 in each apparatus of the component mounting line 1a is transmitted to the member management part 4 through the communication network 2 and the line management system 3, and is written into the storage part 5. Thus, the storage part 5 functions as whereabouts information storage means for storing whereabouts information about the electronic component in a reel unit, and the communication network 2, the line management system 3 and the member management part 4 function as whereabouts information writing means for recording whereabouts information about the electronic component on the storage part 5.

In the present embodiment, the electronic component targeted for mounting includes a moisture management target component (which can alternatively be referred to as a "Moisture Sensitive Device", abbreviated "MSD") to be targeted for management, the moisture management target component which is highly sensitive to moisture and prevents moisture absorption. Member management processing by the member management part 4 and keeping of the reel 8 of the electronic component by the component keeping area 6 in the electronic component mounting system 1 have a function of performing effective moisture management using the MSD as a target. A function provided for member management and moisture management in the electronic component mounting system 1 will hereinafter be described with reference to FIG. 2.

Figure 2:
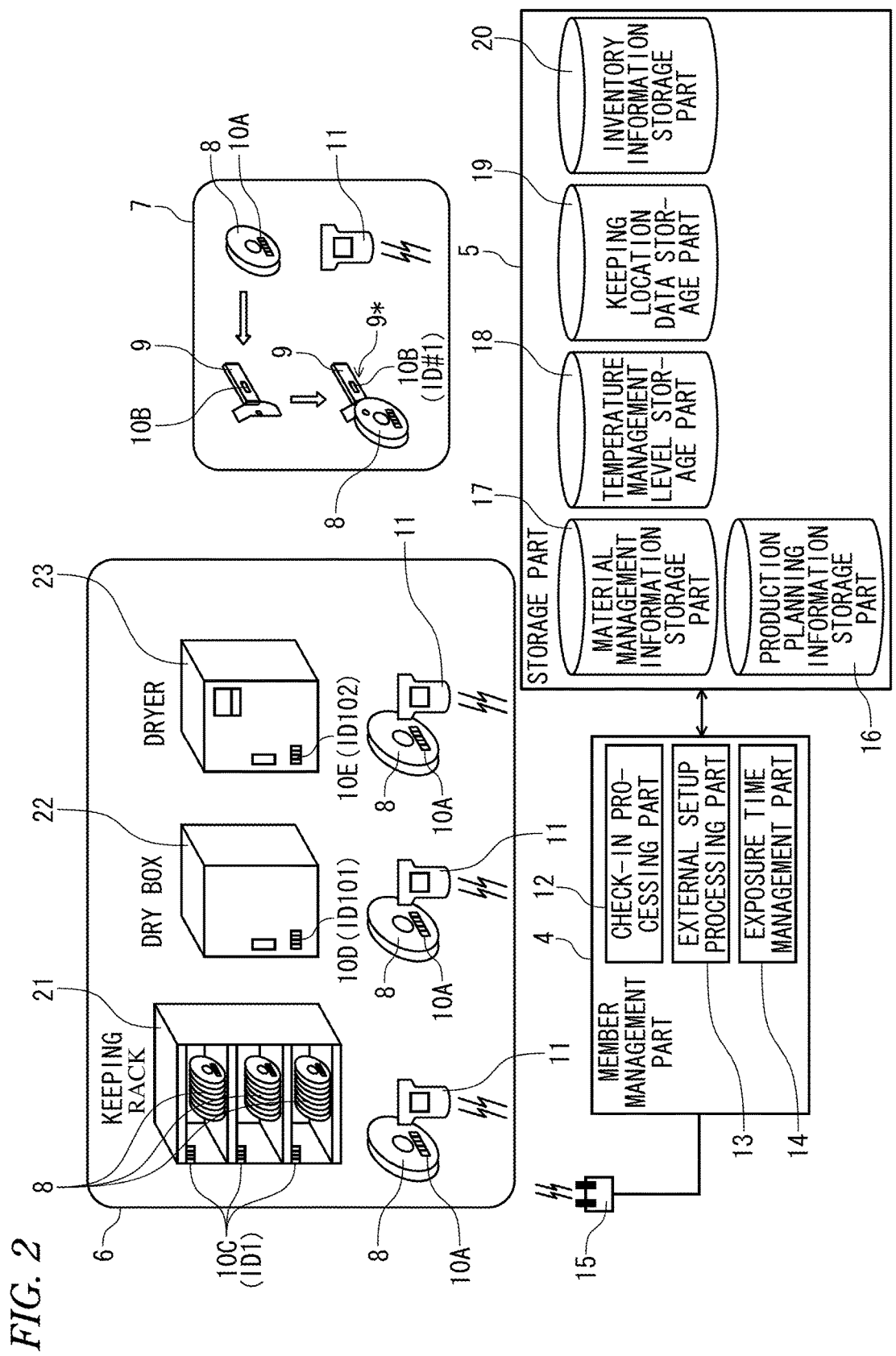
FIG. 2 is a schematic diagram showing material management in the electronic component mounting system of the embodiment of the invention.

FIG. 2 is a schematic diagram showing material management in the electronic component mounting system 1. As shown in FIG. 2, a keeping rack 21, a dry box 22 and a dryer 23 for respectively keeping the reel 8 housing the carrier tape in three kinds of different forms are installed in the component keeping area 6. In the keeping rack 21, the reel 8 is kept in a normal atmosphere of normal temperature and normal humidity. The inside of the keeping rack 21 is provided with plural housing plates 21a for housing the reels 8 in a parallel longitudinal attitude. A bar code label 10C for individually specifying each of the housing plates 21a is stuck on each of the housing plates 21a.

In the dry box 22, the reel 8 housing the MSD is kept at a moisture management level defined on the MSD. The dry box 22 has a moisture adjustment function of always maintaining internal moisture in a prescribed moisture state. The dryer 23 has a heating dry function of dehumidifying the MSD made unusable by once absorbing moisture due to atmospheric exposure and making the MSD reusable. Bar code labels 10D and 10E for respectively specifying the dry box 22 and the dryer 23 are stuck on the dry box 22 and the dryer 23.

At the time of dispatch in which the reel 8 is taken out of the keeping rack 21, the dry box 22 or the dryer 23, or at the time of returning the reel 8 after use, in each case, a bar code label 10A stuck on the reel 8 targeted for dispatch or return and the bar code labels 10C, 10D and 10E for specifying the keeping rack 21, the dry box 22 and the dryer 23 are read by a bar code reader 11 as a portable terminal. The read information is sent to the member management part 4 by a wireless LAN function of the bar code reader 11.

External setup work executed in the external setup area 7 will hereinafter be described. In the present embodiment, as shown in FIG. 2, setup work of the reel 8, in which the reel 8 is preset in the tape feeder 9 having a function of feeding a carrier tape supplied in a state wound on the reel 8 at a pitch before attachment to the first electronic component mounting apparatus M4 or the second electronic component mounting apparatus M5, corresponds to the external setup work. That is, feeder setup work which is work of setting the reel 8 taken out and dispatched from the keeping rack 21, the dry box 22 or the dryer 23 in the component keeping area 6 in the tape feeder 9 to construct a component supply unit 9* is done in the external setup area 7. At this time, the bar code labels 10A and 10B respectively stuck on the reel 8 and the tape feeder 9 are read by the bar code reader 11. The read information is sent to the member management part 4 by the wireless LAN function of the bar code reader 11.

As shown in FIG. 2, the member management part 4 has a check-in processing part 12, an external setup processing part 13 and an exposure time management part 14 as internal processing functions, and further has a receiver 15. The receiver 15 receives data sent from a portable input terminal such as the bar code reader 11 manipulated in a region of the inside of the electronic component mounting system 1, for example, the component keeping area 6 or the external setup area 7. The check-in processing part 12 performs record processing in the case where the component keeping area 6 accepts the reel 8, for example, processing of warehousing of a component in the component keeping area 6, that is, registration of the reel 8 accepted newly, and re-registration in the case of accepting the reel 8 having the remaining component returned as the unconsumed component after a part of the reel already registered is used.

The external setup processing part 13 performs data processing required in the case of setting up the reel 8 for the tape feeder 9 executed in the external setup area 7. The data processing is, for example, processing in which data is read from the reel 8 and the tape feeder 9 in a setup work process and is collated with bar code data received by the receiver 15 to check whether or not combination is correct and also setup information for linking these bar code data is created.

The exposure time management part 14 times exposure time for which the component corresponding to the MSD in the electronic components taken out of the component keeping area 6 and used in the component mounting line 1a is in an atmospheric exposure state in a reel unit, and records accumulated exposure time. Here, the bar code reader 11 reads a component ID for the reel 8 dispatched from the component keeping area 6 to thereby decide that the component corresponds to the MSD, and thereby the component is targeted for count-up of the exposure time. Also, when the reel 8 after use is housed in any of the dry box 22 and the dryer 23 and a signal indicating that effect is sent from the bar code reader 11 to the member management part 4, a stop of the count-up is controlled.

Information indicating the accumulated exposure time recorded by the exposure time management part 14 is transmitted to the line management system 3. The line management system 3 compares exposure limit time set for the MSD with the accumulated exposure time at that point in time, and checks the presence or absence of the MSD in which the accumulated exposure time already exceeds its exposure limit time. In the case of checking the presence of the MSD in which the accumulated exposure time already exceeds the exposure limit time, the line management system 3 executes processing in which the first electronic component mounting apparatus M4 or the second electronic component mounting apparatus M5 equipped with the reel 8 of the MSD is specified by whereabouts information stored by the storage part 5 and also work by the electronic component mounting apparatus is stopped. Thus, the line management system 3 is a mounting line control part for comparing the exposure limit time set for the MSD with the exposure time and specifying the electronic component mounting apparatus equipped with the reel 8 of the MSD exceeding the exposure limit time by the whereabouts information and also stopping the work by the electronic component mounting apparatus.

The storage part 5 stores various data for mounting operation execution or production management transmitted from the line management system 3 and various data acquired through the receiver 15 by the member management part 4 and processed by the internal processing functions described above. These data are recorded on a production planning information storage part 16, a material management information storage part 17, a moisture management level storage part 18, a keeping location data storage part 19 and an inventory information storage part 20 shown in FIG. 2.

The production planning information storage part 16 stores planning information transmitted from the line management system 3, that is, a type name of a substrate targeted for production, the number of substrates produced, scheduled date and time of start and end of production, etc. The material management information storage part 17 stores management information about a component present in each region of the electronic component mounting system 1 in a centralized manner. In the present embodiment, these pieces of management information are stored in a form of a material management table 30 shown in FIG. 3. The material management table 30 has data configuration in which a component name 32 of a component, the remaining number 33, whereabouts information 34, an MSD flag 35, exposure limit time 36 and exposure time 37 are associated with a component ID 31 for individually specifying the component.

The remaining number 33 indicates the number of components remaining. The whereabouts information 34 indicates whereabouts segment and position of an electronic component corresponding to the component ID 31, and includes a keeping location ID, a feeder ID, an apparatus ID and a slot number of a component supply part. That is, when the reel 8 is kept in the component keeping area 6, the keeping location ID for specifying a keeping location such as the keeping rack 21, the dry box 22 or the dryer 23 is assigned to whereabouts information about the reel 8 and is stored. Also, when the reel 8 is at external setup work in the external setup area 7, the feeder ID for specifying the tape feeder 9 at setup work is assigned to the whereabouts information about the reel 8 and is stored. Also, when the reel 8 is already attached to the component mounting line 1a and is used, information read at the time of feeder attachment work, that is, the apparatus ID indicating any of the first electronic component mounting apparatus M4 and the second electronic component mounting apparatus M5, the feeder ID of the tape feeder 9 in which the reel 8 is set, and the slot number of the component supply part to which the tape feeder 9 is attached are assigned to the whereabouts information about the reel 8 and are stored. Here, the remaining number 33 in the case where the whereabouts is the component mounting line 1a as shown in the component IDs "0005", "0006" shown in FIG. 3 is updated in real time through the line management system 3 by sequentially subtracting the number of components consumed by the first electronic component mounting apparatus M4 or the second electronic component mounting apparatus M5 in apparatus operation.

The MSD flag 35 indicates a state as to whether or not the component corresponds to the MSD which is the moisture management target component in a form of flag information identified by ON or OFF. In an example shown in FIG. 3, a component name "BBB" with the component ID of "0004", "0005" corresponds to the MSD, so that ON is set in the MSD flag 35. A component of the component ID "0004" corresponding to the MSD is kept in the dry box 22 (keeping location ID101) in the component keeping area 6, and progression of moisture absorption is prevented. Since a component of the component ID "0005" is already attached to a feeder of ID#3 and is present in a slot No. 11 in the second electronic component mounting apparatus M5 of an apparatus ID#2, the component is in a state in which exposure time progresses.

When a component is the MSD, the exposure limit time 36 indicates exposure limit time indicating a limit of exposure limit capable of using the component without trouble. The exposure limit time 36 is individually defined according to a kind of component and is transmitted from the line management system 3 to the member management part 4. The exposure time 37 indicates accumulated exposure time obtained by accumulating and adding exposure time timed by the exposure time management part 14. Timing of the exposure time by the exposure time management part 14 is started by registering information about the tape feeder 9 as whereabouts information about the reel 8 of the MSD by the whereabouts information writing means described above. That is, the fact that the reel 8 is set in the tape feeder 9 is read by the bar code reader 11, and timing with which its read result is written into the material management information storage part 17 of the member management part 4 as the whereabouts information 34 is used as a starting point and the timing of the exposure time for the reel 8 is started.

When the component "BBB" of the component ID "0004" shown in FIG. 3 is kept in the dry box 22 in the component keeping area 6 and the MSD flag 35 indicates information about the dry box 22, the exposure time management part 14 decides that moisture absorption of the electronic component housed in the reel 8 is prevented, and stops timing of the exposure time for the MSD. Also, when whereabouts information registered in the reel 8 of the MSD by the whereabouts information writing means described above is information about the dryer 23 for removing moisture of the electronic component, the exposure time management part 14 decides that a moisture absorption state of the electronic component housed in the reel 8 is improved, and decreases the exposure time for the MSD according to processing time in the dryer 23. When the processing time is time sufficient for the accumulated exposure time in this case, the accumulated exposure time is reset at 0.

The moisture management level storage part 18 stores exposure limit time according to a management level defined every kind of MSD targeted for use in the electronic component mounting system 1. The exposure time management by the line management system 3 which is the mounting line control part described above determines whether or not component mounting work by the corresponding electronic component mounting apparatus is stopped by comparing the exposure limit time read out of the moisture management level storage part 18 with the accumulated exposure time timed by the exposure time management part 14.

The keeping location data storage part 19 stores a correspondence relation between an actual keeping location and the keeping location ID in the component keeping area 6. Here, the keeping rack 21, the dry box 22 and the dryer 23 respectively correspond to a keeping location ID1, a keeping location ID101 and a keeping location ID102 (see FIG. 2). The inventory information storage part 20 stores information about the tape feeder 9 or the reel 8 used in component mounting work using a kind of substrate targeted for production as a target. The information also includes setup information indicating combination of the tape feeder 9 and the reel 8 in the external setup area 7.

Next, an electronic component mounting method executed by the electronic component mounting system 1 will be described with reference to FIGS. 4 and 5. In the electronic component mounting method of the present embodiment, whereabouts information about an electronic component is registered in a whereabouts information storage part in a reel unit and also exposure time for which the MSD which is the moisture management target component is in an atmospheric exposure state is timed in a reel unit, and the exposure time is compared with exposure limit time set for the MSD and an electronic component mounting apparatus equipped with the reel 8 of the MSD exceeding the exposure limit time is specified by the whereabouts information and also work by the electronic component mounting apparatus is stopped.

First, the details of check-in processing executed by the check-in processing part 12 in the case of warehousing of an electronic component in the component keeping area 6 will be described with reference to FIG. 4. An electronic component targeted for the check-in processing includes both of the case of accepting a new unused electronic component in the component keeping area 6 and the case of being returned as the remaining component after use is started in the component mounting line 1a.

Figure 4:
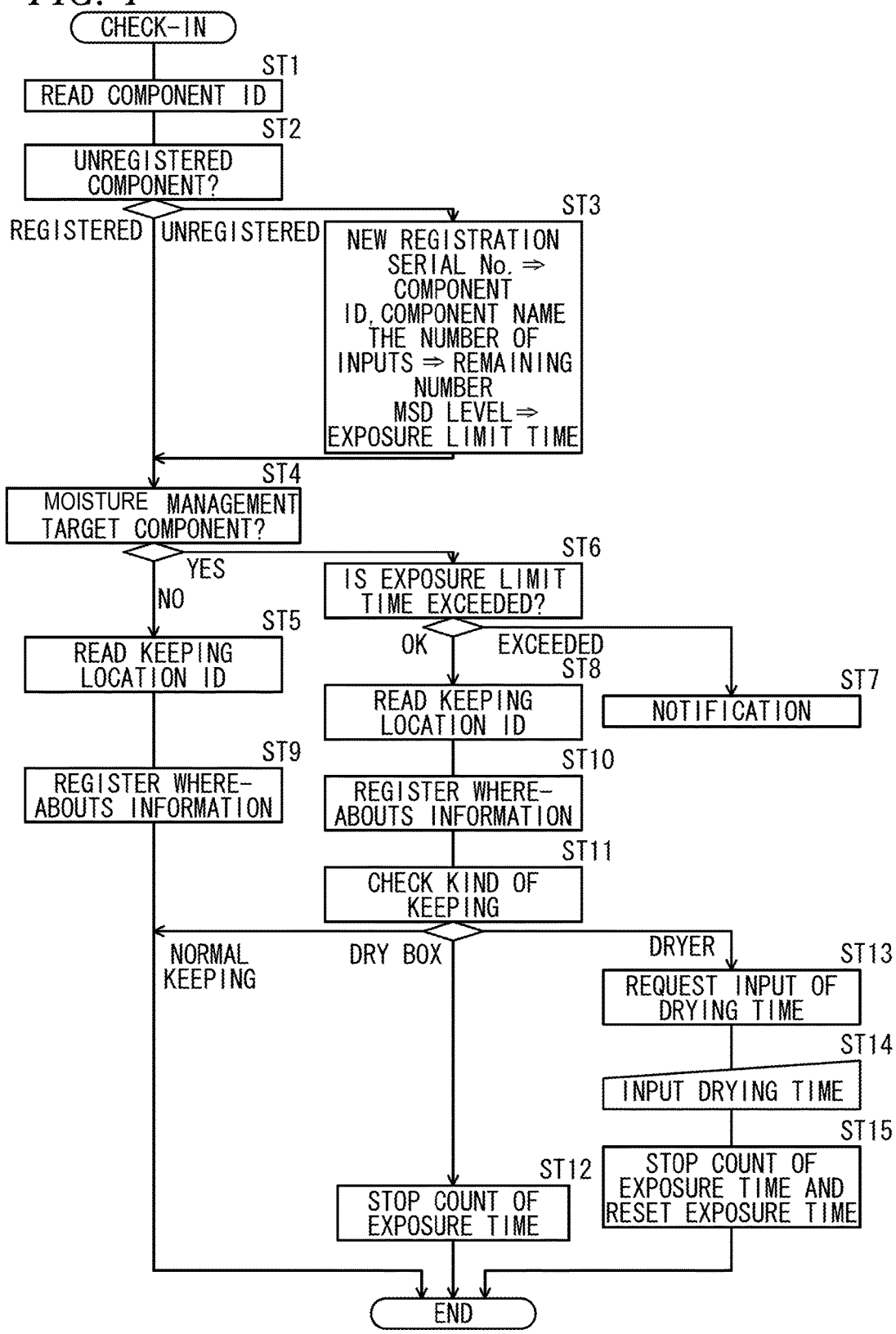
FIG. 4 is a flow diagram showing component check-in processing in the electronic component mounting system of the embodiment of the invention.

As shown in FIG. 4, a component ID of an electronic component carried in the component keeping area 6 is read by the bar code reader 11 (ST1). The read result is transmitted to the member management part 4 through a wireless LAN, and the check-in processing part 12 determines whether or not the electronic component is an unregistered component by referring to the material management information storage part 17 of the member management part 4 (ST2). In the case of determining that the electronic component is the new unregistered component in step ST2, the electronic component is newly registered (ST3). That is, using the read component ID as a key, a serial No, the component name 32, the number of inputs indicating the number of components per reel and the MSD flag 35 are automatically read from a host system and are written into the material management table 30. Accordingly, the remaining number 33 shown in the material management table 30 of FIG. 3 is updated and the MSD flag 35 is displayed and also when the electronic component is the MSD, the exposure limit time 36 according to an MSD level stored by the moisture management level storage part 18 is written.

Also, in the case of determining that the electronic component is the registered electronic component in step ST2, it is determined whether or not the electronic component is the MSD (moisture management target component) by referring to the material management table 30 (ST4). When the electronic component is not the MSD and is a normal component, a keeping location is the keeping rack 21, so that the reel 8 housing the electronic component is housed in any housing plate 21a of the keeping rack 21 and also, the bar code label 10C attached to the housing plate 21a is read as a keeping location ID by the bar code reader 11 (ST5).

Also, in the case of determining that the electronic component is the MSD in step ST4, it is determined whether or not the electronic component exceeds exposure limit time by referring to the exposure limit time 36 and the exposure time 37 of the material management table 30 (ST6). When the electronic component already exceeds the exposure limit time, the electronic component cannot be used as it is, so that notification to that effect is provided (ST7).

In the case of deciding that the electronic component does not exceed the exposure limit time yet and can be used, a worker decides a proper keeping location, that is, which of the keeping rack 21, the dry box 22 and the dryer 23 the electronic component should be kept in from the accumulated exposure time of the electronic component at that point in time, and the electronic component is housed in the proper keeping location decided. For example, in the case of deciding that the exposure limit time has a sufficient margin and atmospheric exposure is permitted until the time of actual use, normal keeping by the keeping rack 21 is selected. Also, in the case of deciding that the exposure limit time has no margin and atmospheric exposure is restricted, keeping by the dry box 22 is selected. Further, when the accumulated exposure time is near to or already exceeds the exposure limit time, it is decided that drying treatment for dehumidification is required, and keeping by the dryer 23 is selected.

Subsequently, the bar code label 10 (any of the bar code labels 10C, 10D, 10E) stuck on its keeping location is read as a keeping location ID by the bar code reader 11 (ST8). Then, whereabouts information is respectively registered based on the read result of the keeping location ID in step ST5 or step ST8 (ST9, ST10). That is, in step ST9, as shown in the component name "AAA" of the component ID "0001", "0003" shown in the material management table 30 of FIG. 3, a keeping location ID1 is registered as the whereabouts information 34.

Also, in the MSD, a kind of keeping is checked after step ST10 (ST11). When normal keeping by the keeping rack 21 is checked, the keeping location ID1 is registered as the whereabouts information 34 like a normal component. Also, when keeping by the dry box 22 is checked in step ST11, as shown in the component name "BBB" of the component ID "0004" shown in the material management table 30 of FIG. 3, a keeping location ID101 indicating the dry box 22 is registered as the whereabouts information 34 and also, count of exposure time by the exposure time management part 14 is stopped (ST12). That is, when whereabouts information registered in the reel 8 of the MSD by the whereabouts information writing means is information about the dry box 22 for keeping the electronic component in a low-moisture environment, the exposure time management part 14 performs processing for stopping timing of the exposure time for the MSD.

Also, when keeping by the dryer 23 is checked in step ST11, an input of drying time is requested from a worker by, for example, screen display of an operating panel surface (ST13). The worker inputs the drying time decided as being proper for the MSD by the request (ST14). Accordingly, the count of exposure time is stopped and also after a lapse of the drying time inputted, processing for resetting the exposure time for the MSD, that is, for subtracting accumulated exposure time of the amount dehumidified by drying and keeping from the accumulated exposure time or resetting the accumulated exposure time at 0 is performed (ST15). That is, when whereabouts information registered in the reel 8 of the MSD by the whereabouts information writing means is information about the dryer 23 for removing moisture of the electronic component, the exposure time management part 14 performs processing for decreasing the exposure time for the MSD according to processing time in the dryer 23.

Next, feeder setup processing as external setup work executed in the external setup area 7 will be described with reference to FIG. 5. A component ID assigned to the reel 8 of an electronic component dispatched from the component keeping area 6 and moved to the external setup area 7 is read (ST21). Then, it is checked whether or not the electronic component is a proper component by collating the read result with component information stored by the inventory information storage part 20 of the storage part 5 (ST22). When the collated result is NG, error notification to the effect that the electronic component differs is provided (ST23), and the feeder setup is ended.

When the collated result is OK in step S22, it is checked whether or not the electronic component is the MSD (moisture management target component) by referring to the MSD flag 35 of the material management table 30 (ST24). When the electronic component corresponds to the MSD (Yes in step S24), count of exposure time is started by the exposure time management part 14 of the member management part 4 (ST25). In addition, a target of the count of exposure time includes the case of setting the reel 8 of an unused MSD in the tape feeder 9 and the case of setting the reel 8 once kept in the dry box 22 or the dryer 23 in the tape feeder 9. In both cases, timing of exposure time is started every feeder setup shown in FIG. 5. That is, the timing of exposure time for the MSD is started in the case of doing work of attaching the reel 8 of the MSD to the tape feeder 9 constructing the component supply unit.

Next, it is decided whether or not exposure limit time is exceeded by comparing the accumulated exposure time to date with the exposure limit time stored in the moisture management level storage part 18 of the storage part 5 (ST26). In the case of already exceeding the exposure limit time, the worker is notified of the effect that the electronic component cannot be used through a wireless LAN etc. (ST27), and the feeder setup using the electronic component as a target is ended. In the present embodiment, when exposure limit of the reel 8 exceeds the exposure limit time in the case of doing work of attaching the reel 8 of the MSD to the tape feeder 9 constructing the component supply unit, notification to that effect is provided.

Also, in the case of determining that the exposure limit time is not exceeded in step ST26 (the case of OK), the possibility of reaching the exposure limit time within a preset predetermined time is predicted (ST28). That is, when the accumulated exposure time at this point in time is compared with necessary work predictive time presumed to be necessary to use up the MSD of the reel 8 in the electronic component mounting system 1 and it is predicted to reach the exposure limit time before the MSD is used up, notification to that effect is provided by a usage expiration reach advance notice (ST30), and the feeder setup using the electronic component as a target is ended. In the present embodiment, when exposure limit of the reel 8 does not exceed the exposure limit time but it is predicted to reach the exposure limit time before the MSD is usedup in the electronic component mounting system 1 in the case of doing work of attaching the reel 8 of the MSD to the tape feeder 9 constructing the component supply unit, notification to that effect is provided.

In the case of determining that there is no possibility of reaching the exposure limit time within the predetermined time in step ST28 (the case of OK), it is determined that the reel 8 housing the component is an electronic component usable without problem, and it proceeds to setup work to the tape feeder 9. In the setup work, a feeder ID of the tape feeder 9 targeted for setup is first read (ST29). In addition, in the case of deciding that the electronic component does not correspond to the MSD in step ST24, the processing proceeds to step ST29 without passing through steps ST25 to step ST28.

Subsequently, it is checked whether or not the tape feeder is a proper tape feeder 9 adapted for the electronic component by collating the read result with feeder information stored in the inventory information storage part 20 of the storage part 5 (ST31). When the collated result is NG, error notification to the effect that the tape feeder 9 differs is provided (ST33), and the feeder setup is ended. When the collated result is OK in step S31, setup information and whereabouts information are registered (ST32). That is, the setup information indicating combination of a feeder ID of the tape feeder 9 and a component ID of the authorized reel 8 set up is recorded on the inventory information storage part 20 of the storage part 5 and also the whereabouts information indicating the present whereabouts location is recorded on the material management information storage part 17 of the storage part 5 and thereby, the whereabouts information 34 is written into the material management table 30.

Figure 5:
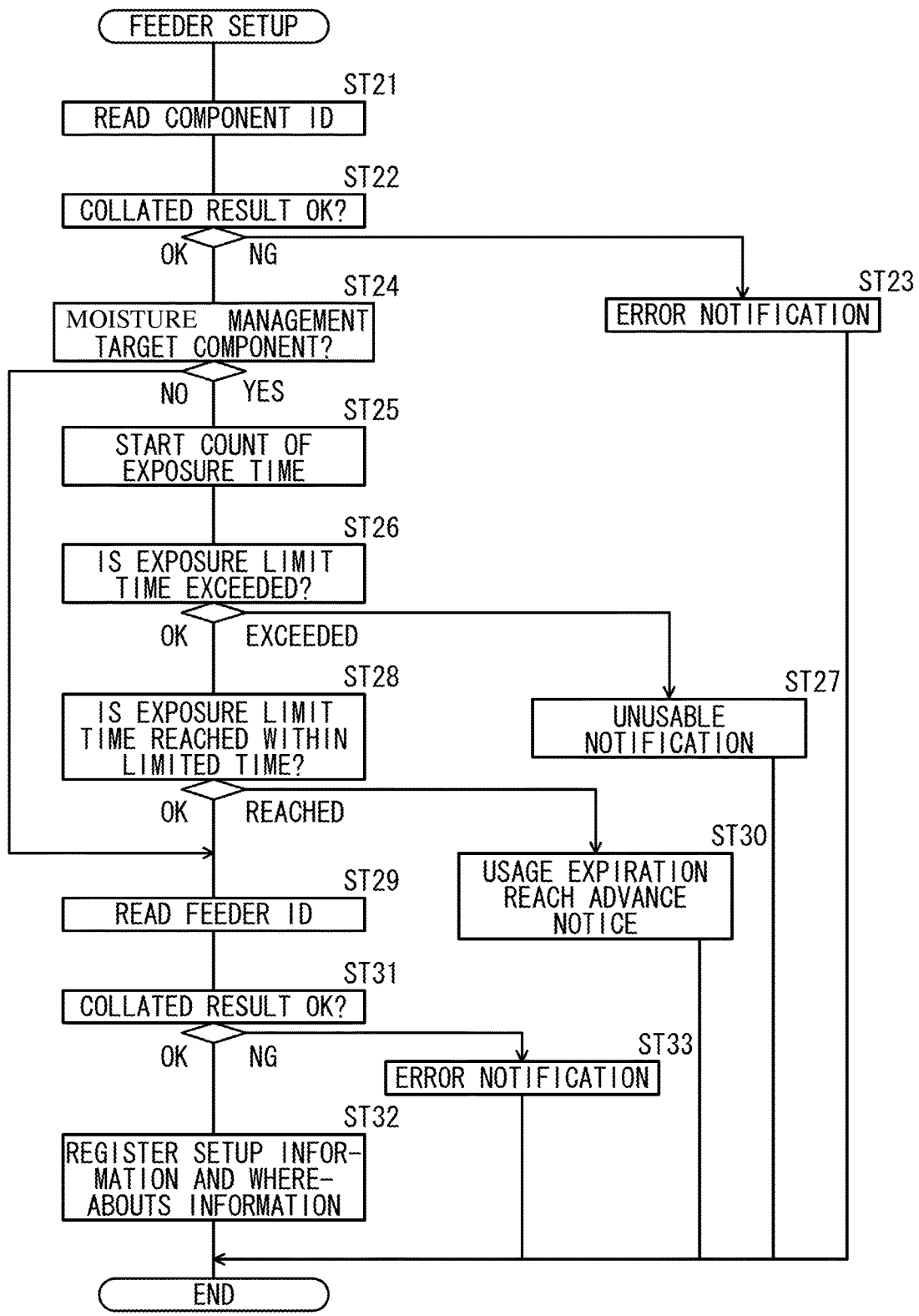
FIG. 5 is a flow diagram showing feeder setup processing in the electronic component mounting system of the embodiment of the invention.

The embodiment described above is constructed so as to time the exposure time from the timing with which it is proved to be the MSD by reading of the component ID during execution of the feeder setup shown in FIG. 5, but the timing with which timing of the exposure time is started can be set freely in the range from the time after the start to the time immediately after the completion of the feeder setup. For example, it may be constructed so as to start timing of the exposure time with the timing of the completion of registration of setup information and whereabouts information shown in step ST32. In this case, at the time when information about the component supply unit including the reel 8 and the tape feeder 9 is registered as whereabouts information about the reel 8 of the MSD by the whereabouts information writing means described above, the exposure time management part 14 starts timing of the exposure time for the reel 8. Also, when whereabouts information registered in the reel 8 of the MSD by the whereabouts information writing means is information about the dry box 22 for keeping the electronic component in a low-moisture environment, the exposure time management part 14 stops timing of the exposure time for the MSD.

As described above, the electronic component mounting system and the electronic component mounting method of the present embodiment are constructed so that after the reel 8 of the MSD which is the moisture management target component is dispatched from the component keeping area 6 and setup to the tape feeder 9 is performed in the external setup area 7, the exposure time management part 14 times the exposure time for which the MSD is in an atmospheric exposure state in a unit of the reel 8 and the exposure time is compared with exposure limit time set for the MSD and stored in the moisture management level storage part 18 and the electronic component mounting apparatus equipped with the reel 8 of the MSD whose exposure time exceeds the exposure limit time is specified and also work by the apparatus is stopped. Accordingly, use of the MSD can properly be managed to prevent defects in quality resulting from use of the electronic component degraded by moisture absorption.

The invention has been described in detail with reference to the specific embodiment, but it is apparent to those skilled in the art that various changes or modifications can be made without departing from the spirit and scope of the invention.

The present application is based on Japanese patent application (patent application No. 2012-106424) filed on May 8, 2012, and the contents of the patent application are hereby incorporated by reference.

INDUSTRIAL APPLICABILITY

An electronic component mounting system and an electronic component mounting method of the invention have an effect capable of properly managing use of a moisture management target component, and are useful in the field in which component mounting work of mounting an electronic component including the moisture management target component requiring moisture management is performed.

DESCRIPTION OF REFERENCE NUMERALS AND SIGNS

1 ELECTRONIC COMPONENT MOUNTING SYSTEM
1*a* COMPONENT MOUNTING LINE
2 COMMUNICATION NETWORK
8 REEL
9 TAPE FEEDER
10A,10B,10C,10D,10E BAR CODE LABEL
11 BAR CODE READER
15 RECEIVER
M4 FIRST ELECTRONIC COMPONENT MOUNTING APPARATUS
M5 SECOND ELECTRONIC COMPONENT MOUNTING APPARATUS

The invention claimed is:
1. An electronic component mounting method performed by an electronic component mounting system having an electronic component mounting apparatus for mounting electronic components, including moisture management target components that require moisture management, on a substrate, the electronic component mounting method comprising:

registering, in a whereabouts information storage part, whereabouts information about the moisture management target components in a reel unit;

timing, in the reel unit, exposure time for which the moisture management target components are in an atmospheric exposure state;

comparing the exposure time with exposure limit time set for a moisture management target component of the moisture management target components;

specifying, by the whereabouts information, the electronic component mounting apparatus equipped with a reel of the moisture management target components exceeding the exposure limit time, and stopping the electronic component mounting apparatus from its work of mounting electronic components;

processing the moisture management target components in a dryer with a heating function for removing moisture of moisture management target components on the reel, by keeping the reel in the dryer;

incrementally decreasing the exposure time for the moisture management target component according to multiple increments of processing time in the dryer; and predicting whether moisture management target components that have not exceeded the exposure time limit will reach the exposure limit time before the moisture management target components are used up by comparing accumulated exposure time with necessary predictive time presumed to be necessary to use up the moisture management target components of the reel;

providing notification when it is predicted that the moisture management target components that have not exceeded the exposure time limit will reach the exposure limit time before the moisture management target components are used up in the electronic component mounting system.

2. The electronic component mounting method of claim 1, wherein the electronic component mounting apparatus is configured to supply the electronic components through a component supply unit in which the reel is set, and timing of exposure time for the moisture management target component is started when work of setting the reel of the moisture management target component in the component supply unit is performed.

3. The electronic component mounting method of claim 2, wherein timing of exposure time for the moisture management target component is stopped while the reel of the moisture management target component is kept in a dry box for keeping an electronic component in a low-moisture environment.

4. The electronic component mounting method of claim 1, wherein, when work of setting the reel of the moisture management target component in the component supply unit is performed and the exposure time of the reel exceeds the exposure limit time, notification to that effect is provided.

5. The electronic component mounting method of claim 1, wherein some of the electronic components are not moisture management target components and the reel unit containing the electronic components is kept in a keeping rack when the electronic components are not moisture management target components.

* * * * *